US009672957B2

(12) United States Patent
Kordecki et al.

(10) Patent No.: US 9,672,957 B2
(45) Date of Patent: Jun. 6, 2017

(54) SHIELDED ELECTRICAL CABLE

(71) Applicant: 3M INNOVATIVE PROPERTIES COMPANY, St. Paul, MN (US)

(72) Inventors: David L. Kordecki, Austin, TX (US); Douglas B. Gundel, Cedar Park, TX (US); Saujit Bandhu, Singapore (SG)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 15/027,290

(22) PCT Filed: Nov. 24, 2014

(86) PCT No.: PCT/US2014/067041
§ 371 (c)(1),
(2) Date: Apr. 5, 2016

(87) PCT Pub. No.: WO2015/088751
PCT Pub. Date: Jun. 18, 2015

(65) Prior Publication Data

US 2016/0276062 A1 Sep. 22, 2016

Related U.S. Application Data

(60) Provisional application No. 61/915,565, filed on Dec. 13, 2013.

(51) Int. Cl.
*H05K 9/00* (2006.01)
*H01B 11/06* (2006.01)
(Continued)

(52) U.S. Cl.
CPC ........... *H01B 7/0823* (2013.01); *H01B 7/009* (2013.01); *H01B 11/18* (2013.01);
(Continued)

(58) Field of Classification Search
CPC .. H01B 7/0823; H01B 7/0838; H01B 7/0861; H01B 11/203; H01B 7/009; H01B 11/18; H01B 11/1891; H01B 11/1895
(Continued)

(56) References Cited

U.S. PATENT DOCUMENTS 3,775,552 A 11/1973 Schumacher
4,234,759 A * 11/1980 Harlow ................ H01B 11/203 174/103
(Continued)

FOREIGN PATENT DOCUMENTS

WO WO 2012/030362 3/2012
WO WO 2012/039736 3/2012
WO WO 2013/074149 5/2013

OTHER PUBLICATIONS

PCT International Search Report from PCT/US2014/067041 mailed on May 19, 2015, 9 pages.
"3M Twin Axial Cable, SL8800 Series", Apr. 15, 2013, 1 page.

*Primary Examiner* — Sherman Ng
(74) *Attorney, Agent, or Firm* — Robert S. Moshrefzadeh

(57) ABSTRACT

A shielded electrical cable (50) includes conductor sets (51*a*, 51*b*) spaced apart along a width of the cable and extending along a length of the cable. Each conductor set includes first and second insulated conductors (52*a*, 52*b*), one or two drain grounding wires (54) disposed between the first and second insulated conductors, first and second conductive shielding films (56*a*, 56*b*) disposed on opposite first and second sides of the conductor set, and an adhesive layer (59) bonding the first shielding film to the second shielding film.

18 Claims, 6 Drawing Sheets

(51) Int. Cl.

| | |
|---|---|
| ***H01B 9/02*** | (2006.01) |
| ***H01B 7/00*** | (2006.01) |
| ***H01B 7/08*** | (2006.01) |
| ***H01B 11/20*** | (2006.01) |
| ***H01B 11/18*** | (2006.01) |

(52) U.S. Cl.
CPC ..... *H01B 11/1891* (2013.01); *H01B 11/1895* (2013.01); *H01B 11/203* (2013.01); *H01B 7/0838* (2013.01); *H01B 7/0861* (2013.01)

(58) Field of Classification Search
USPC .... 174/36, 102 R, 105 R, 110 R, 113 R, 350
See application file for complete search history.

(56) References Cited

U.S. PATENT DOCUMENTS

| | | | | |
|---|---|---|---|---|
| 5,250,127 A * | 10/1993 | Hara | H01B 7/385 156/247 |
| 6,444,902 B1 * | 9/2002 | Tsao | H01B 7/0861 174/113 R |
| 6,803,518 B2 * | 10/2004 | Chang | H01B 11/002 174/113 R |
| 2003/0085052 A1 * | 5/2003 | Tsao | H01B 7/0861 174/113 R |
| 2012/0267159 A1 * | 10/2012 | Gundel | H01B 7/0838 174/350 |
| 2013/0146326 A1 * | 6/2013 | Gundel | H01B 7/0838 174/102 R |

* cited by examiner

SHIELDED ELECTRICAL CABLE

TECHNICAL FIELD

The present disclosure relates generally to shielded electrical cables for the transmission of electrical signals. In particular, the present invention relates to shielded electrical cables that can be mass-terminated, provide high speed electrical properties, and reduce common mode impedance.

BACKGROUND

Electrical cables for transmission of electrical signals are well known. One common type of electrical cable is a coaxial cable. Coaxial cables generally include an electrically conductive wire surrounded by an insulator. The wire and insulator are surrounded by a shield, and the wire, insulator, and shield are surrounded by a jacket. Another common type of electrical cable is a shielded electrical cable comprising one or more insulated signal conductors surrounded by a shielding layer formed, for example, by a metal foil. To facilitate electrical connection of the shielding layer, a further un-insulated conductor is sometimes provided between the shielding layer and the insulation of the signal conductor or conductors. Although electrical cables have been developed to facilitate mass-termination techniques, i.e., the simultaneous connection of a plurality of conductors to individual contact elements, such as, e.g., electrical contacts of an electrical connector or contact elements on a printed circuit board, these cables often have limitations in the ability to mass-produce them, in the ability to prepare their termination ends, in their flexibility, and in their electrical performance. Data rates for most applications are about 10 Gigabits per second and above. As the data rates increase to support more bandwidth requirement, the requirement for crosstalk, impedance control and common mode parameters are also becoming more stringent. Moreover, compact cable designs in which a drain grounding wire is not on the same plane as the signal wires causes the conductors to buckle or stretch relative each other when the cable folded or bent. In view of the advancements in high speed electrical and electronic components, a continuing need exists for electrical cables that are capable of transmitting high speed signals, facilitate mass-termination techniques, are cost-effective, are compact, and can be used in a large number of applications.

SUMMARY

In one aspect, the present invention provides a shielded electrical cable including a plurality of conductor sets spaced apart along a width of the cable and extending along a length of the cable. Each conductor set includes first and second insulated conductors, a drain grounding wire disposed between the first and second insulated conductors, first and second conductive shielding films disposed on opposite first and second sides of the conductor set, and an adhesive layer bonding the first shielding film to the second shielding film. Each insulated conductor includes a central conductor surrounded by an insulative material, the central conductor having a diameter D1. The drain grounding wire has a wire diameter D2. The first and second conductive shielding films include primary and secondary cover portions and primary and secondary pinched portions arranged such that, in transverse cross section, the primary cover portions of the first and second shielding films in combination substantially surround each of the first and second insulated conductors; the secondary cover portions of the first and second shielding films in combination substantially surround the drain grounding wire; the primary pinched portions of the first and second shielding films in combination form primary pinched portions of the conductor set on each side of the conductor set; and the secondary pinched portions of the first and second shielding films in combination form secondary pinched portions of the conductor set on each side of the drain grounding wire. The adhesive layer bonds the first shielding film to the second shielding film in the primary pinched portions of the conductor set, where a maximum separation between the first and second shielding films in the primary cover portions is $d_{1,max}$; a maximum separation between the first and second shielding films in the secondary cover portions is $d_{2,max}$; a minimum separation between the first and second shielding films in the primary pinched portions is $d_{3,min}$; a minimum separation between the first and second shielding films in the secondary pinched portions is $d_{4,min}$; and $d_{3,min}<d_{4,min}<D2\leq d_{2,max}<d_{1,max}$.

In another aspect, the present invention provides a shielded electrical cable including a plurality of conductor sets spaced apart along a width of the cable and extending along a length of the cable. Each conductor set includes first and second insulated conductors, a drain grounding wire disposed between the first and second insulated conductors, first and second conductive shielding films disposed on opposite first and second sides of the conductor set, and an adhesive layer bonding the first shielding film to the second shielding film. Each insulated conductor includes a central conductor surrounded by an insulative material, the central conductor having a diameter $D_1$. The drain grounding wire has a wire diameter $D_2$. The first and second conductive shielding films include primary cover portions, and primary and secondary pinched portions arranged such that, in transverse cross section the primary cover portions of the first and second shielding films in combination substantially surround each of the first and second insulated conductors; the primary pinched portions of the first and second shielding films in combination form primary pinched portions of the conductor set on each side of the conductor set; and the secondary pinched portions of the first and second shielding films in combination form a secondary pinched portion of the conductor set between the first and second insulated conductors. The adhesive layer bonds the first shielding film to the second shielding film in the primary pinched portions of the conductor set, where a maximum separation between the first and second shielding films in the primary cover portions is $d_{1,max}$; a minimum separation between the first and second shielding films in the primary pinched portions is $d_{3,min}$; a maximum separation between the first and second shielding films in the secondary pinched portion is $d_{4,max}$; a minimum separation between the first and second shielding films in the secondary pinched portion is $d_{4,min}$; $d_{3,min}<d_{4,min}$; $d_{4,max}<1.2\ D_2<d_{1,max}$; and $h<D_2$.

In a further aspect, the present invention provides a shielded electrical cable including a plurality of conductor sets extending along a length of the cable and being spaced apart from each other along a width of the cable. Each conductor set includes two or more insulated conductors, first and second shielding films disposed on opposite sides of the cable, an adhesive layer bonding the first shielding film to the second shielding film, and first and second spaced apart un-insulated drain grounding wires. The first and second shielding films include cover portions and pinched portions arranged such that, in transverse cross section, the cover portions of the first and second films in combination substantially surround each conductor set, and the pinched portions of the first and second films in combination form pinched portions of the cable on each side of each conductor set. The adhesive layer bonds the first shielding film to the second shielding film in the pinched portions of the cable. The plurality of the conductor sets includes a first conductor set closest to a second conductor set, the first and second conductor sets being separated by a first pinched portion of the cable. The first and second spaced apart un-insulated drain grounding wires have respective wire diameters $d_1$ and $d_2$ and are disposed in the first pinched portion of the cable between the first and second shielding films, $d_{min}$ being the lesser of $d_1$ and $d_2$. A minimum separation between the first and second shielding films in the first pinched portion of the cable is $t_{min}$, where $t_{min}$ is less than $d_{min}$.

The above summary of the present invention is not intended to describe each disclosed embodiment or every implementation of the present invention. The Figures and detailed description that follow below more particularly exemplify illustrative embodiments.

DETAILED DESCRIPTION

In the following detailed description of the preferred embodiments, reference is made to the accompanying drawings that form a part hereof. The accompanying drawings show, by way of illustration, specific embodiments in which the invention may be practiced. It is to be understood that other embodiments may be utilized, and structural or logical changes may be made without departing from the scope of the present invention. The following detailed description, therefore, is not to be taken in a limiting sense, and the scope of the invention is defined by the appended claims.

Figure 1:
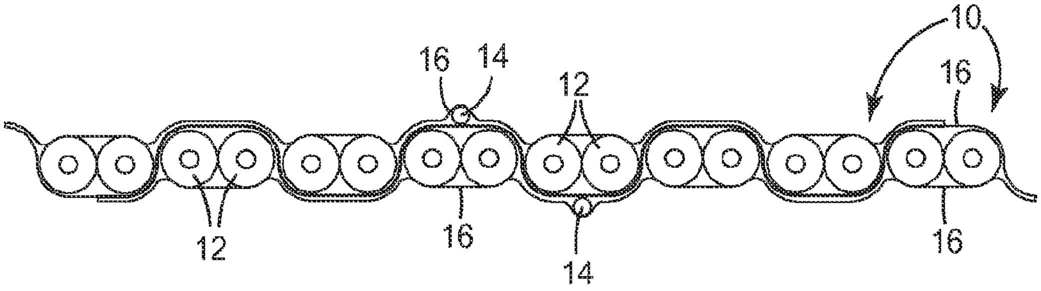
FIG. 1 Prior Art
FIG. 1 is a front cross-sectional view of a prior art nested shielded electrical cable.
Figure 2:
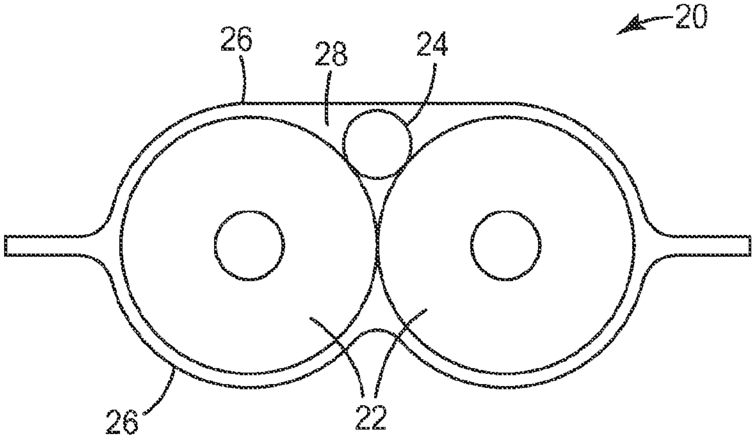
FIG. 2 Prior Art
FIG. 2 is a front cross-sectional view of a prior art shielded electrical cable.

Referring now to the Figures, FIG. 1 illustrates two nested prior art shielded electrical cables 10, in which a pair of insulated conductors 12 is provided, and a drain grounding wire 14 is disposed offset from the pair of insulated conductors 12. Two generally parallel shielding films 16 are disposed around the insulated conductors 12 and the drain grounding wire 14. Two of the shielded electrical cables 10 are illustrated to be nested together. A disadvantage of this shielded electrical cable 10 is that drain grounding wire 14 is not on the same plane as the insulated conductors 12, which typically causes the insulated conductors 12 to buckle or stretch relative each other when the cable is folded or bent. FIG. 2 illustrates another prior art shielded electrical cable 20. Shielded electrical cable 20 includes a pair of insulated conductors 22 and a drain grounding wire 24. Two shielding films 26 are disposed around the insulated conductors 22 and the drain grounding wire 24 such that the drain grounding wire 24 is included in the interstitial space 28 between the insulated conductors 22 and one of the shielding films 26. Although the configuration of the shielded electrical cable 20 is more compact than that of the previous shielded electrical cable 10, it still has the same issues with the insulated conductors 22 buckling or stretching relative to each other when the cable is folded or bent.

Figure 3:
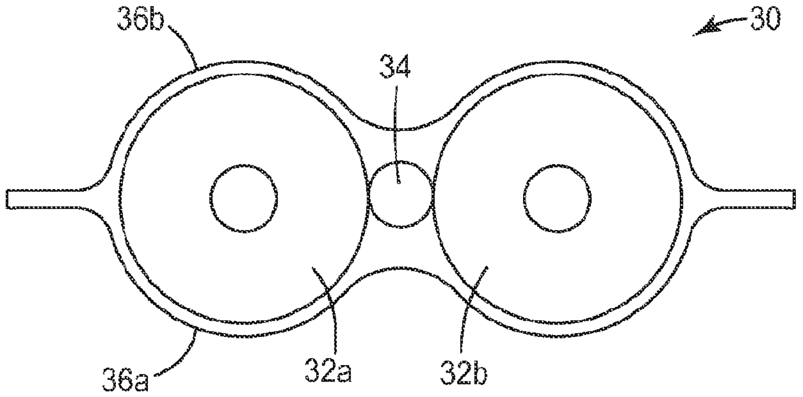
FIG. 3 is a front cross-sectional view of an exemplary embodiment of a shielded electrical cable according to an aspect of the present invention.

FIG. 3 illustrates an exemplary embodiment shielded electrical cable 30 according to an aspect of the present invention, in which a pair of insulated conductors 32*a* and 32*b* are provided and a drain grounding wire 34 is disposed between the insulated conductors 32*a* and 32*b* and on the same plane as the insulated conductors. The insulated conductors 32*a* and 32*b* may include insulated signal wires or insulated power wires. A first conductive shielding film 36*a* and a second conductive shielding film 36*b* are disposed around the insulated conductors 32*a* and 32*b*, and the drain grounding wire 34. In one embodiment, each insulated conductor 32*a* and 32*b* has a substantially curvilinear cross-sectional shape, and the conductive shielding films 36*a* and 36*b* are disposed such as to substantially conform to and maintain the cross-sectional shape. Maintaining the cross-sectional shape maintains the electrical characteristics of the shielded electrical cable 30 as intended in the design of the shielded electrical cable 30. This is an advantage over some conventional shielded electrical cables where disposing a conductive shield around a conductor set changes the cross-sectional shape of the insulated conductors. In certain embodiments, a shielded electrical cable may further include an insulative jacket (not shown) disposed around the conductive shielding films 36*a* and 36*b*.

Although in the embodiment illustrated in FIG. 3 one pair of insulated conductors 32*a* and 32*b* is included, in other embodiments, the number of pairs of insulated conductors is not limited. Typically, the insulated conductors 32*a* and 32*b* are configured to form a multiple twinaxial cable, i.e., multiple conductor sets each including two insulated conductors 32*a* and 32*b*. For example, shielded electrical cable 30 optionally includes four conductor sets (not shown) each including two insulated conductors 32*a* and 32*b*.

Figure 4A:
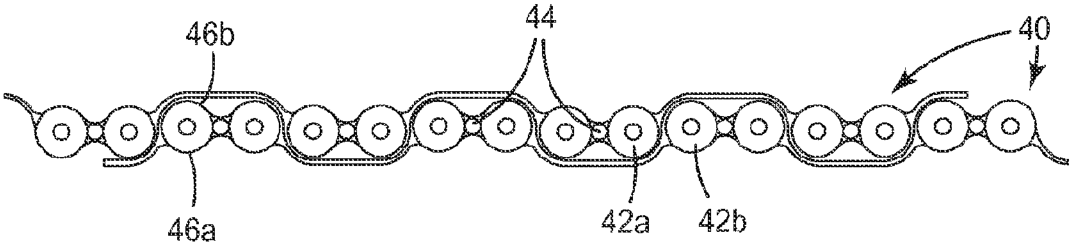
FIG. 4A is a front cross-sectional view of an exemplary embodiment of a nested shielded electrical cable according to an aspect of the present invention.
Figure 4B:
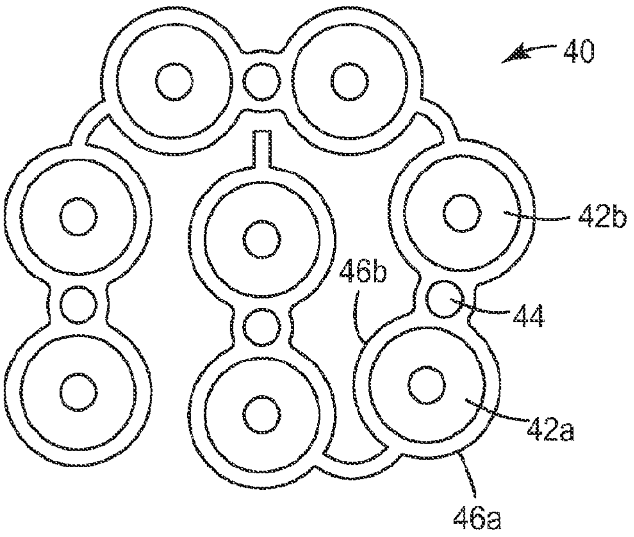
FIG. 4B is a front cross-sectional view of an exemplary embodiment of a folded shielded electrical cable according to an aspect of the present invention.

FIG. 4A illustrates two nested exemplary embodiment shielded electrical cables 40, in which a pair of insulated conductors 42*a* and 42*b* is provided and a drain grounding wire 44 is disposed between the insulated conductors 42*a* and 42*b* and on the same plane as the insulated conductors. A first conductive shielding film 46*a* and a second conductive shielding film 46*b* are disposed around the insulated conductors 42*a* and 42*b*, and the drain grounding wire 44. Two of the shielded electrical cables 40 are illustrated to be nested together. Advantageously, the exemplary configuration provides a compact design for the shielded electrical cable 40. FIG. 4B illustrates that there is little or no differential stress on the insulated conductors 42a and 42b when the shielded electrical cable 40 is folded.

Figure 5:
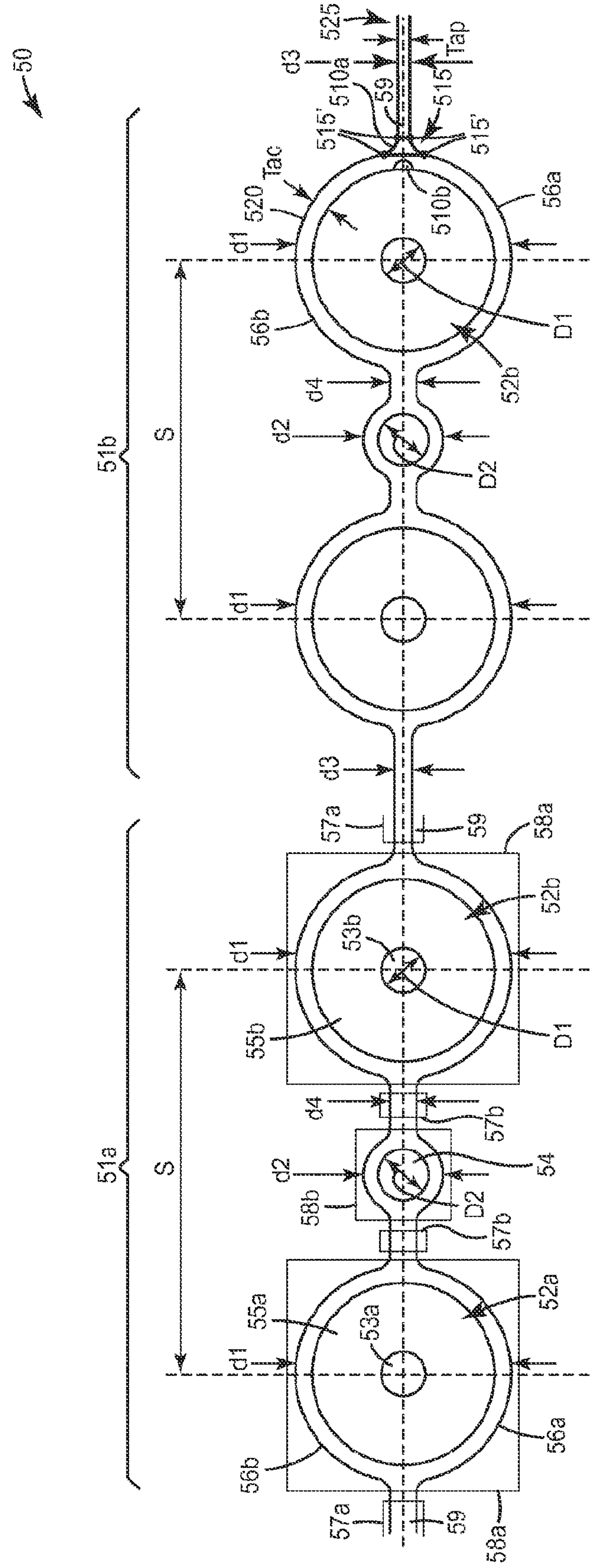
FIG. 5 is a front cross-sectional view of another exemplary embodiment of a shielded electrical cable according to an aspect of the present invention.

Referring to FIG. 5, an exemplary embodiment shielded electrical cable 50 comprises a plurality of conductor sets 51a and 51b spaced apart along a width of the cable and extending along a length of the cable. Each conductor set 51a and 51b comprises a first insulated conductor 52a and a second insulated conductor 52b. Each insulated conductor comprises a central conductor 53a and 53b surrounded by an insulative material 55a and 55b, the central conductor 53a and 53b each having a diameter $D_1$. The insulated conductors 52a and 52b may include insulated signal wires or insulated power wires. A drain grounding wire 54 is disposed between the first and second insulated conductors 52a and 52b and has a wire diameter $D_2$. Each conductor set 51a and 51b further comprises a first conductive shielding film 56a and a second conductive shielding film 56b disposed on opposite first and second sides of the conductor set and comprising primary and secondary cover portions 58a and 58b and primary and secondary pinched portions 57a and 57b. In one embodiment, each insulated conductor 52a and 52b has a substantially curvilinear cross-sectional shape, and the shielding films 56a and 56b are disposed such as to substantially conform to and maintain the cross-sectional shape.

The cover portions 58a and 58b and pinched portions 57a and 57b are arranged such that, in transverse cross section: the primary cover portions 58a of the first and second conductive shielding films 56a and 56b in combination substantially surround each of the first and second insulated conductors 52a and 52b. The secondary cover portions 58b of the first and second shielding films 56a and 56b in combination substantially surround the drain grounding wire 54. The primary pinched portions 57a of the first and second conductive shielding films 56a and 56b in combination form primary pinched portions 57a of the conductor set on each side of the conductor set 51a and 51b. Further, the secondary pinched portions 57b of the first and second conductive shielding films 56a and 56b in combination form secondary pinched portions 57b of the conductor set on each side of the drain grounding wire 54.

Each conductor set 51a and 51b further comprises an adhesive layer 59 bonding the first conductive shielding film 56a to the second conductive shielding film 56b in the primary pinched portions 57a of the conductor set. A maximum separation between the first and second conductive shielding films 56a and 56b in the primary cover portions 58a is $d_{1,max}$; a maximum separation between the first and second conductive shielding films 56a and 56b in the secondary cover portions 58b is $d_{2,max}$; a minimum separation between the first and second conductive shielding films 56a and 56b in the primary pinched portions 57a is $d_{3,min}$; a minimum separation between the first and second conductive shielding films 56a and 56b in the secondary pinched portions 57b is $d_{4,min}$; and $d_{3,min}<d_{4,min}<D_2\leq d_{2,max}<d_{1,max}$. Providing a configuration having the relationship of $d_{3,min}<d_{4,min}<D_2\leq d_{2,max}<d_{1,max}$ enhances the electrical isolation of the first and second insulated conductors 52a and 52b from each other and of each conductor set 51a and 51b from each other.

In certain exemplary embodiments, when the cable 50 is laid flat, a central axis of the drain grounding wire 54 and the central axes of the central conductors 53a and 53b of the first and second insulated conductors 52a and 52b of each conductor set 51a and 51b lie in a same plane. Typically, the drain grounding wire 54 is un-insulated. In certain exemplary embodiments a center-to-center separation between the first and second insulated conductors is S, with a ratio $(D_1+D_2)/S$ being at least 0.9. The shielded electrical cable further optionally has a first cross-sectional area $A_1$ defined as an area between the first and second insulated conductors and the first and second conductive shielding films. The drain grounding wire has a second cross-sectional area $A_2$, with a ratio $A_1/A_2$ being at least 0.9.

The adhesive layer preferably bonds the first shielding film to the second shielding film in the secondary pinched portions of the conductor set. The adhesive layer is typically a conformable adhesive layer for conforming to the first shielding film and the second shielding film. In certain embodiments of a shielded electrical cable, primary cover portions include a concentric portion substantially concentric with at least one of the insulated conductors.

Figure 6:
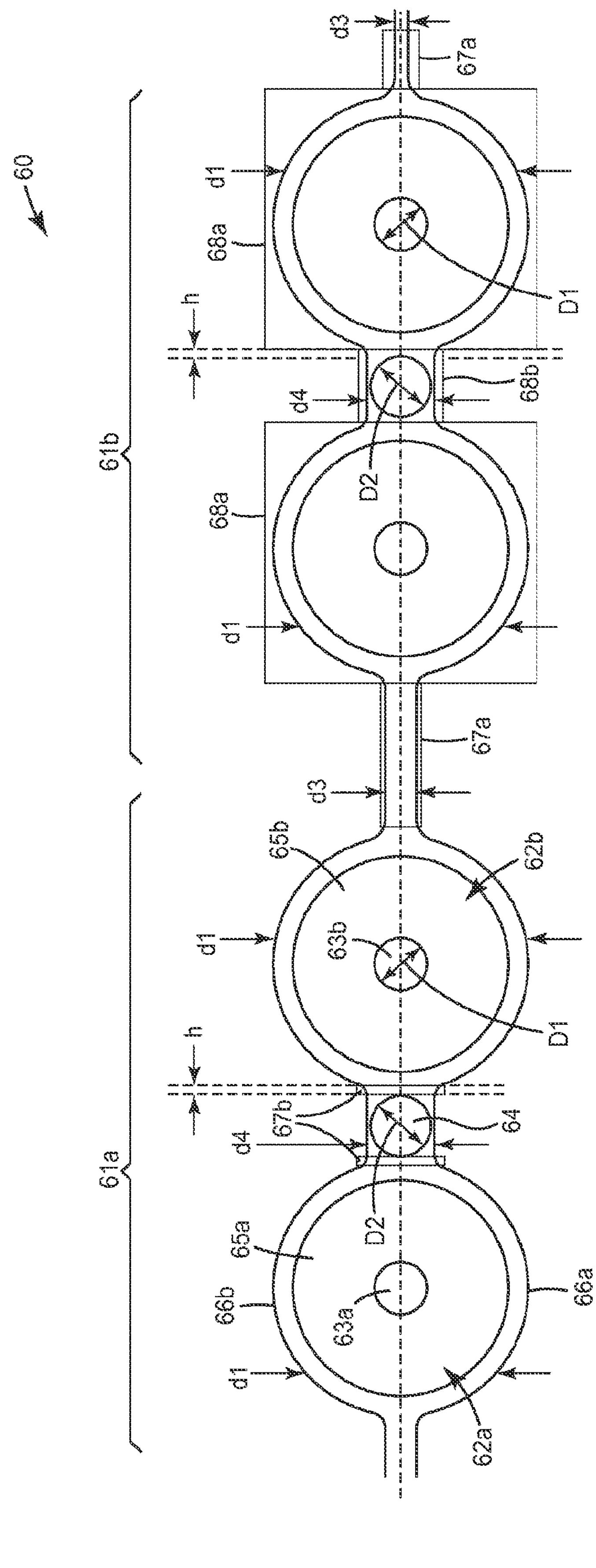
FIG. 6 is a front cross-sectional view of a further exemplary embodiment of a shielded electrical cable according to an aspect of the present invention.

Referring to FIG. 6, an exemplary embodiment shielded electrical cable 60 comprises a plurality of conductor sets 61a and 61b spaced apart along a width of the cable and extending along a length of the cable. Each conductor set 61a and 61b comprises a first insulated conductor 62a and a second insulated conductor 62b. The insulated conductors 62a and 62b may include insulated signal wires or insulated power wires. Each insulated conductor comprises a central conductor 63a and 63b surrounded by an insulative material 65a and 65b, the central conductor 63a and 63b each having a diameter $D_1$. A drain grounding wire 64 is disposed between the first and second insulated conductors 62a and 62b and has a wire diameter $D_2$. Each conductor set 61a and 61b further comprises a first conductive shielding film 66a and a second conductive shielding film 66b disposed on opposite first and second sides of the conductor set and comprising primary and secondary cover portions 68a and 68b and primary and secondary pinched portions 67a and 67b. In one embodiment, each insulated conductor 62a and 62b has a substantially curvilinear cross-sectional shape, and the first and second conductive shielding films 66a and 66b are disposed such as to substantially conform to and maintain the cross-sectional shape.

The cover portions 68a and 68b and pinched portions 67a and 67b are arranged such that, in transverse cross section: the primary cover portions 68a of the first and second shielding films 66a and 66b in combination substantially surround each of the first and second insulated conductors 62a and 62b. The secondary cover portions 68b of the first and second shielding films 66a and 66b in combination substantially surround the drain grounding wire 64. The primary pinched portions 67a of the first and second shielding films 66a and 66b in combination form primary pinched portions 67a of the conductor set on each side of the conductor set 61a and 61b. Further, the secondary pinched portions 67b of the first and second conductive shielding films 66a and 66b in combination form a secondary pinched portion 67b of the conductor set between the first and second insulated conductors 62a and 62b.

Each conductor set 61a and 61b further comprises an adhesive layer 69 bonding the first conductive shielding film 66a to the second conductive shielding film 66b in the primary pinched portions 67a of the conductor set. A maximum separation between the first and second conductive shielding films 66a and 66b in the primary cover portions 68a is $d_{1,max}$; a minimum separation between the first and second conductive shielding films 66a and 66b in the primary pinched portions 67a is $d_{3,min}$; a maximum separation between the first and second conductive shielding films 66a and 66b in the secondary pinched portion 67b is $d_{4,max}$; a minimum separation between the first and second conductive shielding films 66a and 66b in the secondary pinched portion 67*b* is $d_{4,min}$; $d_{3,min}<d_{4,min}$; $d_{4,max}<1.2\ D_2<d_{1,max}$; and $h<D_2$. As used herein, "h" refers to the shortest distance between an insulated conductor 62*a* or 62*b* and the drain grounding wire 64. A benefit of selecting h to be less than $D_2$ is a higher density of the shielded electrical cable than a cable in which h is greater than $D_2$. Providing a configuration having the relationship of $d_{3,min}<d_{4,min}$; $d_{4,max}<1.2\ D_2<d_{1,max}$ enhances the electrical isolation of the first and second insulated conductors 62*a* and 62*b* from each other and of each conductor set 61*a* and 61*b* from each other.

In certain exemplary embodiments, when the cable 60 is laid flat, a central axis of the drain grounding wire 64 and the central axes of the central conductors 63*a* and 63*b* of the first and second insulated conductors 62*a* and 62*b* of each conductor set 61*a* and 61*b* lie in a same plane. The drain grounding wire 64 is typically un-insulated. Optionally, the primary cover portions include a concentric portion substantially concentric with at least one of the insulated conductors.

Figure 7:
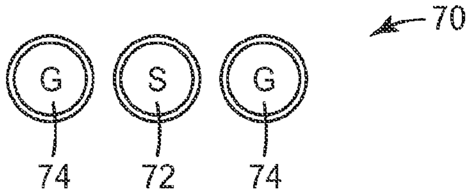
FIG. 7 Prior Art
FIG. 7 is a front cross-sectional schematic of a prior art electrical cable.
Figure 8:
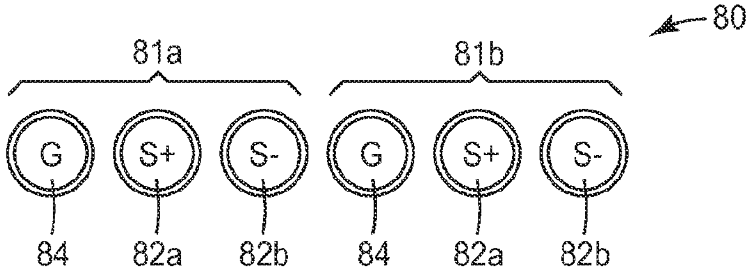
FIG. 8 Prior Art
FIG. 8 is a front cross-sectional schematic of another prior art electrical cable.

Referring to FIG. 7, a schematic of a prior art single ended electrical cable 70 is illustrated. The electrical cable 70 comprises a conductor 72 and two drain grounding wires 74 disposed adjacent to and on either side of the conductor 72, wherein each of the conductor 72 and the drain grounding wires 74 are spaced apart from each other in a width direction of the cable. At data rates of 10 Gbps and above, such an electrical cable 70 often does not meet regulatory requirements for crosstalk, impedance control, and common mode parameters. Referring to FIG. 8, a schematic of a prior art differential electrical cable 80 is illustrated. The electrical cable 80 includes two conductor sets 81*a* and 81*b* spaced apart from each other in a width direction of the cable, each conductor set including two conductors 82*a* and 82*b*. Each conductor set 81*a* and 81*b* includes a drain grounding wire 84 disposed adjacent to one of the two conductors. Although such a differential electrical cable 80 provides inherent immunity to noise as compared to the single ended electrical cable 70, it still may not meet regulatory requirements for crosstalk, impedance control, and common mode parameters.

Figure 9:
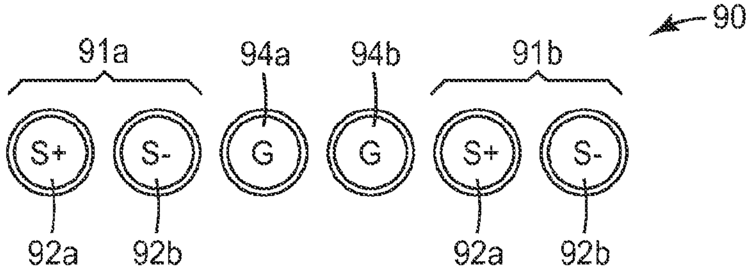
FIG. 9 is a front cross-sectional schematic of an exemplary embodiment of an electrical cable according to an aspect of the present invention.

Referring to FIG. 9, a schematic of an exemplary electrical cable 90 according to an aspect of the present invention is illustrated. The electrical cable 90 includes two conductor sets 91*a* and 91*b* being spaced apart from each other in a width direction of the cable, each conductor set including two conductors 92*a* and 92*b*. The electrical cable 90 further includes two drain grounding wires 94*a* and 94*b* disposed between the two conductor sets 91*a* and 91*b*.

Figure 10:
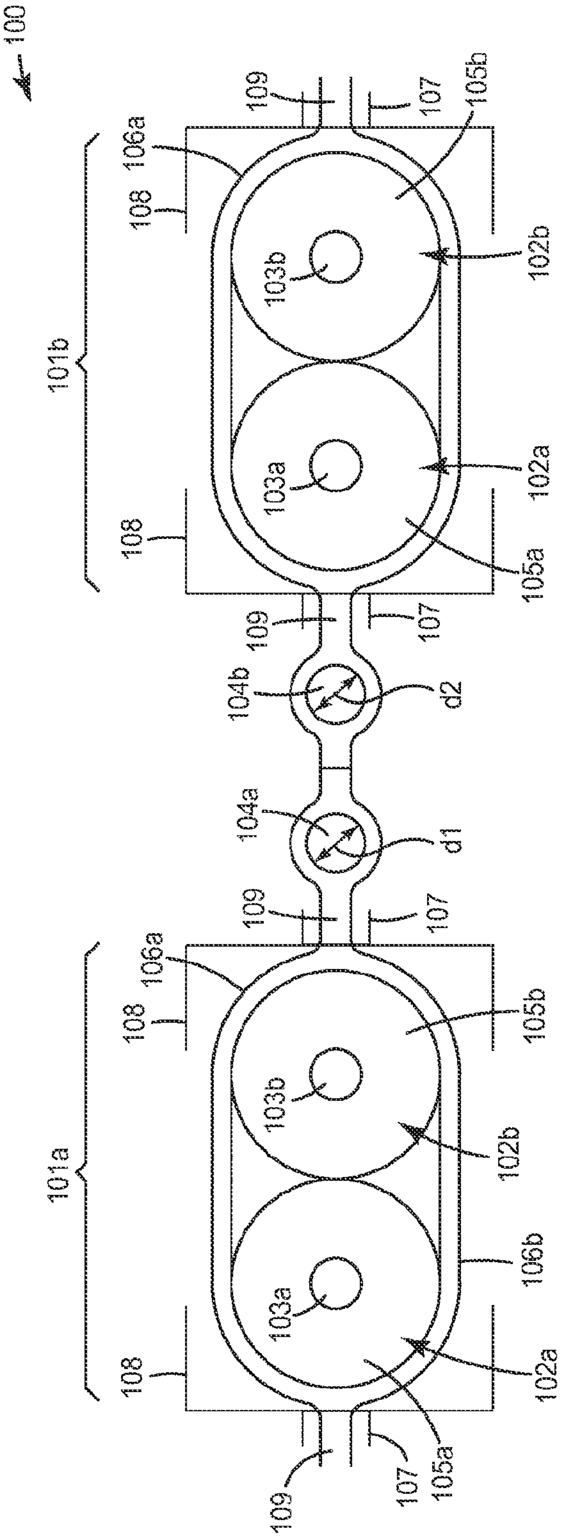
FIG. 10 is a front cross-sectional view of an exemplary embodiment of a shielded electrical cable according to an aspect of the present invention.

FIG. 10 illustrates an exemplary shielded electrical cable 100 comprising a plurality of conductor sets 101*a* and 101*b* extending along a length of the cable 100 and being spaced apart from each other along a width of the cable 100. Each conductor set 101*a* and 101*b* includes a first insulated conductor 102*a* and a second insulated conductor 102*b*. The insulated conductors 102*a* and 102*b* may include insulated signal wires or insulated power wires. Each insulated conductor comprises a central conductor 103*a* and 103*b* surrounded by an insulative material 105*a* and 105*b*. The shielded electrical cable 100 further comprises a first shielding film 106*a* and a second shielding film 106*b* disposed on opposite sides of the cable. The first and second shielding films 106*a* and 106*b* include cover portions 108 and pinched portions 107 arranged such that, in transverse cross section, the cover portions 108 of the first and second shielding films 106*a* and 106*b* in combination substantially surround each conductor set, and the pinched portions 107 of the first and second shielding films 106*a* and 106*b* in combination form pinched portions 107 of the cable on each side of each conductor set 101*a* and 101*b*. In one embodiment, each insulated conductor 102*a* and 102*b* has a substantially curvilinear cross-sectional shape, and the shielding films 106*a* and 106*b* are disposed such as to substantially conform to and maintain the cross-sectional shape.

The shielded electrical cable 100 further comprises an adhesive layer 109 bonding the first shielding film 106*a* to the second shielding film 106*b* in the pinched portions 107 of the cable. The plurality of the conductor sets 101*a* and 101*b* comprise a first conductor set 101*a* adjacent to a second conductor set 101*b*, the first and second conductor sets being separated by a first pinched portion 107 of the cable. The first and second spaced apart un-insulated drain grounding wires 104*a* and 104*b* have respective wire diameters $d_1$ and $d_2$ and are disposed in the first pinched portion 107 of the cable 100 between the first and second shielding films 106*a* and 106*b*, $d_{min}$ being the lesser of $d_1$ and $d_2$. A minimum separation between the first and second shielding films 106*a* and 106*b* in the first pinched portion 107 of the cable 100 is $t_{min}$, $t_{min}$ being less than $d_{min}$. When the cable is laid flat, the central axes of the first and second drain grounding wires 104*a* and 104*b* and the central axes of the insulated conductors 102*a* and 102*b* of the first and second conductor sets 101*a* and 101*b* usually lie in a same plane. An advantage of the exemplary embodiment is that it not only improves crosstalk performance, but also decreases common mode impedance.

In certain embodiments, the first drain grounding wire makes direct electrical contact with the shielding film in at least one location along its length. Alternatively, the first drain grounding wire makes indirect electrical contact with the shielding film in at least one location along its length. For ease of connection, in many embodiments the first drain grounding wire extends beyond at least one of the ends of the shielding film. The primary cover portions preferably include a concentric portion substantially concentric with at least one of the insulated conductors.

The configuration of shielded electrical cables according to aspects of the present invention including a transition portion on one or both sides of the conductor set represents a departure from conventional cable configurations, such as, e.g., an ideal coaxial cable, wherein a shield is generally continuously disposed around a single insulated conductor, or an ideal twinaxial cable, wherein a shield is generally continuously disposed around a pair of insulated conductors. Although these ideal cable configurations provide ideal electromagnetic profiles, these profiles are not necessary to achieve acceptable electrical properties. In the shielded electrical cables according to aspects of the present invention, acceptable electrical properties can be achieved by minimizing the electrical impact of the transition portion, e.g., by minimizing the size of the transition portion and carefully controlling the configuration of the transition portion along the length of the shielded electrical cable. Minimizing the size of the transition portion minimizes the capacitance deviation and minimizes the required space between multiple conductor sets, thereby reducing the conductor set pitch and/or increasing the electrical isolation between conductor sets. Careful control of the configuration of the transition portion along the length of the shielded electrical cable contributes to obtaining predictable electrical behavior and consistency, which is important for high speed transmission lines so that electrical data can be reliably transmitted, and becomes more important when the size of the transition portion cannot be minimized.

In one embodiment, a characteristic impedance of less than 5 to 10 Ohms results in good electrical isolation. In one embodiment, this impedance variation is less than 5 Ohms and preferably less than 3 Ohms along a representative cable length, such as, e.g., 1 m. In another aspect, if the insulated conductors are arranged effectively in a twinaxial or differential pair cable arrangement, this means that the partial coverage of the conductor sets by the shielding film is accomplished with a desired consistency in geometry between the insulated conductors of a pair such as to provide an acceptable impedance variation as suitable for the intended application. In one embodiment, this impedance variation is less than 2 Ohms and preferably less than 0.5 Ohms along a representative cable length, such as, e.g., 1 m.

An electrical characteristic that is often considered is the characteristic impedance of the transmission line. Any impedance changes along the length of a transmission line may cause power to be reflected back to the source instead of being transmitted to the target. Ideally, the transmission line will have no impedance variation along its length, but, depending on the intended application, variations up to 5-10% may be acceptable. Another electrical characteristic that is often considered in twinaxial cables (differentially driven) is skew or unequal transmission speeds of two transmission lines of a pair along at least a portion of their length. Skew produces conversion of the differential signal to a common mode signal that can be reflected back to the source, reduces the transmitted signal strength, creates electromagnetic radiation, and dramatically increases the bit error rate, in particular jitter. Ideally, a pair of transmission lines will have no skew, but, depending on the intended application, a differential S-parameter SCD21 or SCD12 value (representing the differential-to common mode conversion from one end of the transmission line to the other) of less than −25 to −30 dB up to a frequency of interest, such as, e.g., 6 GHz, may be acceptable. Alternatively, skew can be measured in the time domain and compared to a required specification. Depending on the intended application, values of less than about 20 picoseconds/meter (ps/m) and preferably less than about 10 ps/m may be acceptable.

In certain exemplary embodiments, the shielded electrical cable according to an aspect of the present invention includes a transition portion positioned on both sides of the conductor set. This transition portion is configured to provide high manufacturability and strain and stress relief of the shielded electrical cable. In certain embodiments, such as, e.g., embodiments wherein the conductor set includes two substantially parallel longitudinal insulated conductors arranged generally in a single plane and effectively in a twinaxial or differential pair cable arrangement, maintaining this transition portion at a substantially constant configuration along the length of the shielded electrical cable beneficially provides substantially the same electromagnetic field deviation from an ideal concentric case for both conductors in the conductor set. Thus, careful control of the configuration of this transition portion along the length of the shielded electrical cable contributes to the electrical performance of the cable. In certain embodiments, the conductor set and the conductive shielding film are cooperatively configured in an impedance controlling relationship. An impedance controlling relationship means that the conductor set(s), shielding films, and transition portion are cooperatively configured to control the characteristic impedance of the shielded electrical cable.

In part to help achieve acceptable electrical properties, transition portions of the shielded electrical cable may each include a cross-sectional area that is smaller than a cross-sectional area of a conductor. As best shown in FIG. 5, the cross-sectional area 510*a* of transition portion 515 is defined by transition points 515', where the conductive shielding films 56*a* and 56*b* deviate from being substantially concentric with the insulated conductor 52*b*, and the transition points 515', where the conductive shielding films 56*a* and 56*b* deviate from being substantially parallel. In addition, each cross-sectional area 510*a* may optionally include a void portion 510*b*. Void portions 510*b* may be substantially the same.

Further, the adhesive layer 59 may have a thickness $T_{ac}$ in a concentric portion 520, and a thickness in a transition portion 515 that is greater than the thickness $T_{ac}$ in the concentric portion 520. Similarly, the adhesive layer 59 may have a thickness $T_{ap}$ in a parallel portion 525, and a thickness in the transition portion 515 that is greater than the thickness $T_{ap}$ in parallel portion 525. The adhesive layer 59 may represent at least 25% of cross-sectional area 510*a*. The presence of the adhesive layer 59 in the cross-sectional area 510*a*, in particular at a thickness that is greater than the thickness $T_{ac}$ or the thickness $T_{ap}$, contributes to the strength of the transition portion 515. Careful control of the manufacturing process and the material characteristics of the various elements of the shielded electrical cable 50 may reduce variations in the void portion 510*b* and the thickness of the adhesive layer 59 in the transition portion 515, which may in turn reduce variations in the capacitance of the cross-sectional area 510*a*.

An advantage of providing shielded electrical cables arranged generally in a single plane is that such shielded electrical cables are well suited for mass-stripping, i.e., the simultaneous stripping of shielding films and insulated conductors, and mass-termination, i.e., the simultaneous terminating of the stripped ends of insulated conductors and drain grounding wires, which allows a more automated cable assembly process. This is a benefit of the shielded electrical cables according to aspects of the present invention. For example, the stripped ends of insulated conductors and drain grounding wires are optionally terminated to contact elements on a printed circuit board (not shown). In other embodiments, the stripped ends of insulated conductors and drain grounding wires may be terminated to any suitable individual contact elements of any suitable termination point, such as, e.g., electrical contacts of an electrical connector.

The conductors may include any suitable conductive material, including but not limited to copper, silver, aluminum, gold, and alloys thereof. In an aspect, at least one of the conductive shielding films may include a stand-alone conductive film. The construction of the conductive shielding films may be selected based on a number of design parameters suitable for the intended application, such as, e.g., flexibility, electrical performance, and configuration of the shielded electrical cable (such as, e.g., location of drain grounding wires). In one embodiment, the conductive shielding films include an integrally formed conductive shielding film. In one embodiment, the conductive shielding films have a thickness in the range of 0.01 mm to 0.05 mm. The conductive shielding films provide isolation, shielding, and precise spacing between the conductor sets, and enable a more automated and lower cost cable manufacturing process. In addition, the conductive shielding films prevent a phenomenon known as “signal suck-out” or resonance, whereby high signal attenuation occurs at a particular frequency range. This phenomenon typically occurs in conventional shielded electrical cables where a conductive shield is wrapped around a conductor set.

In one aspect, it is beneficial to the electrical performance of a shielded electrical cable according to aspects of the present invention for the pinched portions to have approximately the same size and shape on both sides of a conductor set. Any dimensional changes or imbalances may produce imbalances in capacitance and inductance along the length of the pinched portion. This in turn may cause impedance differences along the length of the pinched portion and impedance imbalances between adjacent conductor sets. At least for these reasons, control of the spacing between the conductive shielding films may be desired. In one embodiment, the conductive shielding films on both sides of a conductor set are spaced apart within about 0.05 mm of each other.

In certain embodiments, an adhesive layer (e.g., 59, 69, or 109) may be disposed on both shielding films, and is preferably a conformable adhesive layer. The adhesive layer may include an insulative adhesive and provide an insulative bond between conductive shielding films. Optionally, the adhesive layer provides an insulative bond between at least one of the conductive shielding films and the insulated conductors, and between at least one of the shielding films and the drain grounding wires. The adhesive layer may include a conductive adhesive and provide a conductive bond between the conductive shielding films. Suitable conductive adhesives include conductive particles to provide the flow of electrical current. The conductive particles can be any of the types of particles currently used, such as spheres, flakes, rods, cubes, amorphous, or other particle shapes. They may be solid or substantially solid particles such as carbon black, carbon fibers, nickel spheres, nickel coated copper spheres, metal-coated oxides, metal-coated polymer fibers, or other similar conductive particles. These conductive particles can be made from electrically insulating materials that are plated or coated with a conductive material such as silver, aluminum, nickel, or indium tin-oxide. The metal-coated insulating material can be substantially hollow particles such as hollow glass spheres, or may comprise solid materials such as glass beads or metal oxides. The conductive particles may be on the order of several tens of microns to nanometer sized materials such as carbon nanotubes. Suitable conductive adhesives may also include a conductive polymeric matrix.

In one aspect, the adhesive layer may include a continuous adhesive layer extending along the entire length and width of the shielding films. In another aspect, the conformable adhesive layer may include a discontinuous adhesive layer. For example, the conformable adhesive layer may be present only in some portions along the length or width of the conductive shielding films. In one embodiment, a discontinuous adhesive layer includes a plurality of longitudinal adhesive stripes that are disposed, e.g., on both sides of each conductor set and drain grounding wires. In one embodiment, the adhesive layer includes at least one of a pressure sensitive adhesive, a hot melt adhesive, a thermoset adhesive, and a curable adhesive. In one embodiment, the adhesive layer is configured to provide a bond between the conductive shielding films that is substantially stronger than a bond between one or more insulated conductors and conductive shielding films. This may be achieved, e.g., by selecting the adhesive formulation accordingly. An advantage of this adhesive configuration is that the conductive shielding films are readily strippable from the insulation of the insulated conductors. In another embodiment, the adhesive layer is configured to provide a bond between the shielding films and a bond between one or more insulated conductors and the conductive shielding films that are substantially equally strong. An advantage of this adhesive configuration is that the insulated conductors are anchored between the conductive shielding films. On bending the shielded electrical cable, this allows for little relative movement and therefore reduces the likelihood of buckling of the conductive shielding films. Suitable bond strengths may be chosen based on the intended application. In one embodiment, the adhesive layer has a thickness of less than about 0.13 mm. In a preferred embodiment, the adhesive layer has a thickness of less than about 0.05 mm.

In certain embodiments, the adhesive layer conforms to achieve desired mechanical and electrical performance characteristics of the shielded electrical cable. In one aspect, the adhesive layer may conform to be thinner between the conductive shielding films in areas between the conductor sets, which increases at least the lateral flexibility of the shielded electrical cable. This allows the shielded electrical cable to be placed more easily into a curvilinear outer jacket. In another aspect, the adhesive layer may conform to be thicker in areas immediately adjacent the conductor sets and substantially conform to the conductor sets. This increases the mechanical strength and enables forming a curvilinear shape of shielding films in these areas, which increases the durability of shielded electrical cable, e.g., during flexing of the cable. In addition, this helps to maintain the position and spacing of the insulated conductors relative to the conductive shielding films along the length of the shielded electrical cable, which results in uniform impedance and superior signal integrity of the shielded electrical cable. In another aspect, the adhesive layer may conform to effectively be partially of completely removed between the conductive shielding films in areas between the conductor sets. As a result, the conductive shielding films electrically contact each other in these areas, which increases the electrical performance of the shielded electrical cable. In another aspect, the adhesive layer may conform to effectively be partially or completely removed between at least one of the conductive shielding films and the drain grounding wires. As a result, the drain grounding wires electrically contact at least one of the conductive shielding films in these areas, which increases the electrical performance of the shielded electrical cable. Even if a thin adhesive layer exists between at least one of the conductive shielding films and the drain grounding wires, asperities on the drain grounding wires may break through the adhesive layer to establish electrical contact as intended.

An aspect of a shielded electrical cable is proper grounding of the shield. Shielded electrical cables according to aspects of the present invention can be grounded in a number of ways. In one aspect, the drain grounding wires electrically contact at least one of the conductive shielding films such that grounding the drain grounding wires also grounds the conductive shielding films. In another aspect, the drain grounding wires do not electrically contact the conductive shielding films, but are individual elements in the cable construction that may be independently terminated to any suitable individual contact element of any suitable termination point, such as, e.g., a contact element on a printed circuit board. In this arrangement, the drain grounding wires may also be referred to as "ground wires". The drain grounding wires typically have a low but non-zero impedance with respect to the conductive shielding films. In one embodiment, the drain grounding wires may include surface asperities or a deformable wire, such as, e.g., a stranded wire, to provide controlled electrical contact between the drain grounding wires and at least one of the conductive shielding films.

The following items are exemplary embodiments of a shielded electrical cable according to aspects of the present invention.

Item 1 is a shielded electrical cable comprising:

a plurality of conductor sets spaced apart along a width of the cable and extending along a length of the cable, each conductor set comprising:

first and second insulated conductors, each insulated conductor comprising a central conductor surrounded by an insulative material, the central conductor having a diameter $D_1$;

a drain grounding wire disposed between the first and second insulated conductors and having a wire diameter $D_2$;

first and second conductive shielding films disposed on opposite first and second sides of the conductor set and comprising primary and secondary cover portions and primary and secondary pinched portions arranged such that, in transverse cross section:

the primary cover portions of the first and second shielding films in combination substantially surround each of the first and second insulated conductors;

the secondary cover portions of the first and second shielding films in combination substantially surround the drain grounding wire;

the primary pinched portions of the first and second shielding films in combination form primary pinched portions of the conductor set on each side of the conductor set; and the secondary pinched portions of the first and second shielding films in combination form secondary pinched portions of the conductor set on each side of the drain grounding wire; and an adhesive layer bonding the first shielding film to the second shielding film in the primary pinched portions of the conductor set, wherein:

a maximum separation between the first and second shielding films in the primary cover portions is $d_{1,max}$;

a maximum separation between the first and second shielding films in the secondary cover portions is $d_{2,max}$;

a minimum separation between the first and second shielding films in the primary pinched portions is $d_{3,min}$;

a minimum separation between the first and second shielding films in the secondary pinched portions is d4,min; and $d_{3,min}<d_{4,min}<D_2\leq d_{2,max}<d_{1,max}$.

Item 2 is the shielded electrical cable of item 1, wherein when the cable is laid flat, a central axis of the un-insulated drain grounding wire and central axes of the central conductors of the first and second insulated conductors of each conductor set lie in a same plane.

Item 3 is the shielded electrical cable of item 1, wherein the drain grounding wire is un-insulated.

Item 4 is the shielded electrical cable of item 1, wherein the adhesive layer bonds the first shielding film to the second shielding film in the secondary pinched portions of the conductor set.

Item 5 is the shielded electrical cable of item 1, wherein a center-to-center separation between the first and second insulated conductors is S, a ratio $(D_1+D_2)/S$ being at least 0.9.

Item 6 is the shielded electrical cable of item 1 having a first cross-sectional area $A_1$ defined as an area between the first and second insulated conductors and the first and second conductive shielding films, the drain grounding wire having a second cross-sectional area $A_2$, a ratio $A_1/A_2$ being at least 0.9.

Item 7 is the shielded electrical cable of item 1, wherein the primary cover portions include a concentric portion substantially concentric with at least one of the insulated conductors.

Item 8 is a shielded electrical cable comprising:

a plurality of conductor sets spaced apart along a width of the cable and extending along a length of the cable, each conductor set comprising:

first and second insulated conductors, each insulated conductor comprising a central conductor surrounded by an insulative material, the central conductor having a diameter $D_1$;

a drain grounding wire disposed between the first and second insulated conductors and having a wire diameter $D_2$;

first and second conductive shielding films disposed on opposite first and second sides of the conductor set and comprising primary cover portions, and primary and secondary pinched portions arranged such that, in transverse cross section;

the primary cover portions of the first and second shielding films in combination substantially surround each of the first and second insulated conductors;

the primary pinched portions of the first and second shielding films in combination form primary pinched portions of the conductor set on each side of the conductor set; and the secondary pinched portions of the first and second shielding films in combination form a secondary pinched portion of the conductor set between the first and second insulated conductors; and an adhesive layer bonding the first shielding film to the second shielding film in the primary pinched portions of the conductor set, wherein:

a maximum separation between the first and second shielding films in the primary cover portions is $d_{1,max}$;

a minimum separation between the first and second shielding films in the primary pinched portions is $d_{3,min}$;

a maximum separation between the first and second shielding films in the secondary pinched portion is $d_{4,max}$;

a minimum separation between the first and second shielding films in the secondary pinched portion is $d_{4,min}$;

$d_{3,min}<d_{4,min}$;

$d_{4,max}<1.2\ D_2<d_{1,max}$; and $h<D_2$.

Item 9 is the shielded electrical cable of item 8, wherein the primary cover portions include a concentric portion substantially concentric with at least one of the insulated conductors.

Item 10 is the shielded electrical cable of item 8, wherein when the cable is laid flat, a central axis of the un-insulated drain grounding wire and central axes of the central conductors of the first and second insulated conductors of each conductor set lie in a same plane.

Item 11 is the shielded electrical cable of item 8, wherein the drain grounding wire is un-insulated.

Item 12 is a shielded electrical cable comprising:

a plurality of conductor sets extending along a length of the cable and being spaced apart from each other along a width of the cable, each conductor set including two or more insulated conductors;

first and second shielding films disposed on opposite sides of the cable, the first and second shielding films including cover portions and pinched portions arranged such that, in transverse cross section, the cover portions of the first and second films in combination substantially surround each conductor set, and the pinched portions of the first and second films in combination form pinched portions of the cable on each side of each conductor set;

an adhesive layer bonding the first shielding film to the second shielding film in the pinched portions of the cable, the plurality of the conductor sets comprising a first conductor set closest to a second conductor set, the first and second conductor sets being separated by a first pinched portion of the cable; and first and second spaced apart un-insulated drain grounding wires having respective wire diameters $d_1$ and $d_2$ and disposed in the first pinched portion of the cable between the first and second shielding films, $d_{min}$ being the lesser of $d_1$ and $d_2$, a minimum separation between the first and second shielding films in the first pinched portion of the cable being $t_{min}$, $t_{min}$ being less than $d_{min}$.

Item 13 is the shielded electrical cable of item 12, wherein, when the cable is laid flat, central axes of the first and second drain grounding wires and central axes of the insulated conductors of the first and second conductor sets lie in a same plane.

Item 14 is the shielded electrical cable of item 12, wherein the first drain grounding wire makes direct electrical contact with the shielding film in at least one location along its length.

Item 15 is the shielded electrical cable of item 12, wherein the first drain grounding wire makes indirect electrical contact with the shielding film in at least one location along its length.

Item 16 is the shielded electrical cable of item 12, wherein the first drain grounding wire extends beyond at least one of the ends of the shielding film.

Item 17 is the shielded electrical cable of claim 12, wherein the primary cover portions include a concentric portion substantially concentric with at least one of the insulated conductors.

Item 18 is the shielded electrical cable of item 12, wherein the conductor set and shielding film are cooperatively configured in an impedance controlling relationship.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electro-mechanical, and electrical arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A shielded electrical cable, comprising:

a plurality of conductor sets spaced apart along a width of the cable and extending along a length of the cable, each conductor set comprising:

first and second insulated conductors, each insulated conductor comprising a central conductor surrounded by an insulative material, the central conductor having a diameter $D_1$;

a drain grounding wire disposed between the first and second insulated conductors and having a wire diameter $D_2$;

first and second conductive shielding films disposed on opposite first and second sides of the conductor set and comprising primary and secondary cover portions and primary and secondary pinched portions arranged such that, in transverse cross section:

the primary cover portions of the first and second shielding films in combination substantially surround each of the first and second insulated conductors;

the secondary cover portions of the first and second shielding films in combination substantially surround the drain grounding wire;

the primary pinched portions of the first and second shielding films in combination form primary pinched portions of the conductor set on each side of the conductor set; and the secondary pinched portions of the first and second shielding films in combination form secondary pinched portions of the conductor set on each side of the drain grounding wire; and an adhesive layer bonding the first shielding film to the second shielding film in the primary pinched portions of the conductor set, wherein:

a maximum separation between the first and second shielding films in the primary cover portions is $d_{1,max}$;

a maximum separation between the first and second shielding films in the secondary cover portions is $d_{2,max}$;

a minimum separation between the first and second shielding films in the primary pinched portions is $d_{3,min}$;

a minimum separation between the first and second shielding films in the secondary pinched portions is $d_{4,min}$; and $d_{3,min} < d_{4,min} < D_2 \le d_{2,max} < d_{1,max}$.

2. The shielded electrical cable of claim 1, wherein when the cable is laid flat, a central axis of the un-insulated drain grounding wire and central axes of the central conductors of the first and second insulated conductors of each conductor set lie in a same plane.

3. The shielded electrical cable of claim 1, wherein the adhesive layer bonds the first shielding film to the second shielding film in the secondary pinched portions of the conductor set.

4. The shielded electrical cable of claim 1, wherein a center-to-center separation between the first and second insulated conductors is S, a ratio $(D_1+D_2)/S$ being at least 0.9.

5. The shielded electrical cable of claim 1 having a first cross-sectional area $A_1$ defined as an area between the first and second insulated conductors and the first and second conductive shielding films, the drain grounding wire having a second cross-sectional area $A_2$, a ratio $A_1/A_2$ being at least 0.9.

6. The shielded electrical cable of claim 1, wherein the primary cover portions include a concentric portion substantially concentric with at least one of the insulated conductors.

7. A shielded electrical cable, comprising:

a plurality of conductor sets spaced apart along a width of the cable and extending along a length of the cable, each conductor set comprising:

first and second insulated conductors, each insulated conductor comprising a central conductor surrounded by an insulative material, the central conductor having a diameter $D_1$;

a drain grounding wire disposed between the first and second insulated conductors and having a wire diameter $D_2$;

first and second conductive shielding films disposed on opposite first and second sides of the conductor set and comprising primary cover portions, and primary and secondary pinched portions arranged such that, in transverse cross section:

the primary cover portions of the first and second shielding films in combination substantially surround each of the first and second insulated conductors;

the primary pinched portions of the first and second shielding films in combination form primary pinched portions of the conductor set on each side of the conductor set; and the secondary pinched portions of the first and second shielding films in combination form a secondary pinched portion of the conductor set between the first and second insulated conductors; and an adhesive layer bonding the first shielding film to the second shielding film in the primary pinched portions of the conductor set, wherein:

a maximum separation between the first and second shielding films in the primary cover portions is $d_{1,max}$;

a minimum separation between the first and second shielding films in the primary pinched portions is $d_{3,min}$;

a maximum separation between the first and second shielding films in the secondary pinched portion is $d_{4,max}$;

a minimum separation between the first and second shielding films in the secondary pinched portion is $d_{4,min}$;

$d_{3,min}<d_{4,min}$;

$d_{4,max}<1.2\ D_2<d_{1,max}$; and $h<D_2$.

8. A shielded electrical cable, comprising:

a plurality of conductor sets extending along a length of the cable and being spaced apart from each other along a width of the cable, each conductor set including two or more insulated conductors;

first and second shielding films disposed on opposite sides of the cable, the first and second shielding films including cover portions and pinched portions arranged such that, in transverse cross section, the cover portions of the first and second films in combination substantially surround each conductor set, and the pinched portions of the first and second films in combination form pinched portions of the cable on each side of each conductor set;

an adhesive layer bonding the first shielding film to the second shielding film in the pinched portions of the cable, the plurality of the conductor sets comprising a first conductor set closest to a second conductor set, the first and second conductor sets being separated by a first pinched portion of the cable; and first and second spaced apart un-insulated drain grounding wires having respective wire diameters $d_1$ and $d_2$ and disposed in the first pinched portion of the cable between the first and second shielding films, $d_{min}$ being the lesser of $d_1$ and $d_2$, a minimum separation between the first and second shielding films in the first pinched portion of the cable being $t_{min}$, $t_{min}$ being less than $d_{min}$.

9. The shielded electrical cable of claim 8, wherein the primary cover portions include a concentric portion substantially concentric with at least one of the insulated conductors.

10. The shielded electrical cable of claim 8, wherein the conductor set and shielding film are cooperatively configured in an impedance controlling relationship.

11. The shielded electrical cable of claim 1, wherein the drain grounding wire is un-insulated.

12. The shielded electrical cable of claim 7, wherein the primary cover portions include a concentric portion substantially concentric with at least one of the insulated conductors.

13. The shielded electrical cable of claim 7, wherein when the cable is laid flat, a central axis of the un-insulated drain grounding wire and central axes of the central conductors of the first and second insulated conductors of each conductor set lie in a same plane.

14. The shielded electrical cable of claim 7, wherein the drain grounding wire is un-insulated.

15. The shielded electrical cable of claim 8, wherein, when the cable is laid flat, central axes of the first and second drain grounding wires and central axes of the insulated conductors of the first and second conductor sets lie in a same plane.

16. The shielded electrical cable of claim 8, wherein the first drain grounding wire makes direct electrical contact with the shielding film in at least one location along its length.

17. The shielded electrical cable of claim 8, wherein the first drain grounding wire makes indirect electrical contact with the shielding film in at least one location along its length.

18. The shielded electrical cable of claim 8, wherein the first drain grounding wire extends beyond at least one of the ends of the shielding film.

* * * * *